(12) United States Patent
Chonnad et al.

(10) Patent No.: US 12,423,491 B2
(45) Date of Patent: Sep. 23, 2025

(54) IDENTIFYING ASSOCIATION OF SAFETY RELATED PORTS TO THEIR SAFETY MECHANISMS THROUGH STRUCTURAL ANALYSIS

(71) Applicant: Synopsys, Inc., Sunnyvale, CA (US)

(72) Inventors: Shivakumar Chonnad, San Jose, CA (US); Abhishek Chauhan, Delhi (IN); Chandan Kumar, Uttar Pradesh (IN); Gourav Goyal, Delhi (IN)

(73) Assignee: Synopsys, Inc., Sunnyvale, CA (US)

( * ) Notice: Subject to any disclaimer, the term of this patent is extended or adjusted under 35 U.S.C. 154(b) by 708 days.

(21) Appl. No.: 17/750,809

(22) Filed: May 23, 2022

(65) Prior Publication Data

US 2022/0382943 A1 Dec. 1, 2022

Related U.S. Application Data

(60) Provisional application No. 63/193,485, filed on May 26, 2021.

(51) Int. Cl.
*G06F 30/33* (2020.01)
(52) U.S. Cl.
CPC .................... *G06F 30/33* (2020.01)
(58) Field of Classification Search
USPC ........................................................ 716/106
See application file for complete search history.

(56) References Cited

U.S. PATENT DOCUMENTS

| | | | |
|---|---|---|---|
| 8,001,498 B2* | 8/2011 | Bjesse | G06F 30/3323 716/106 |
| 8,104,000 B2* | 1/2012 | Bjesse | G06F 30/3323 716/111 |
| 11,216,606 B1* | 1/2022 | Turbovich | G06F 30/3308 |
| 11,250,198 B2* | 2/2022 | Grosse | G01R 31/318342 |
| 11,416,662 B1* | 8/2022 | Armato | G06F 30/3308 |
| 2010/0107131 A1* | 4/2010 | Bjesse | G06F 30/3323 716/106 |
| 2010/0107132 A1* | 4/2010 | Bjesse | G06F 30/3323 716/116 |

* cited by examiner

*Primary Examiner* — Mohammed Alam
(74) *Attorney, Agent, or Firm* — Weaver Austin Villeneuve & Sampson LLP

(57) ABSTRACT

A method of verifying safety in a circuit design, includes, in part, receiving data representative of the circuit design, identifying a first safety mechanism within the circuit design where the safety mechanism is represented by a first module and has an output port defining a first diagnostic point, identifying a multitude of ports of a second module within the circuit design, determining whether at least one port of the second module is associated with a safety concern, performing a backward path tracing from the first diagnostic point to determine if the port falls within a cone of influence of the first safety mechanism, and establishing that a potential fault appearing at the port is detectable at the first diagnostic point if the port is determined to fall within the cone of influence of the first safety mechanism.

20 Claims, 8 Drawing Sheets

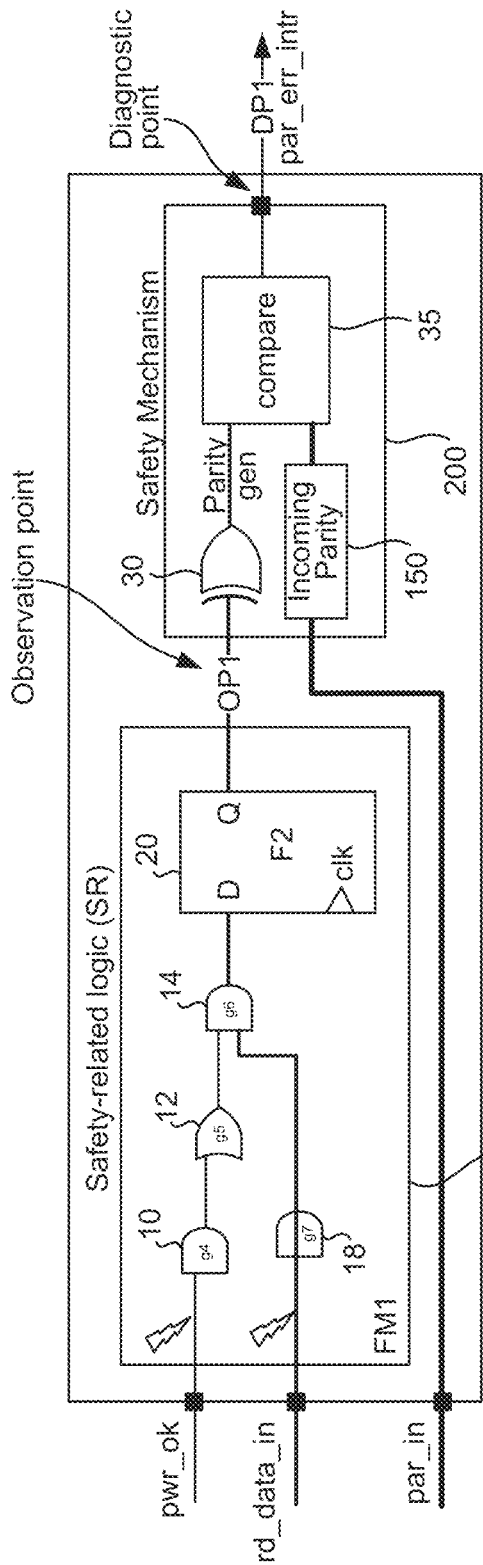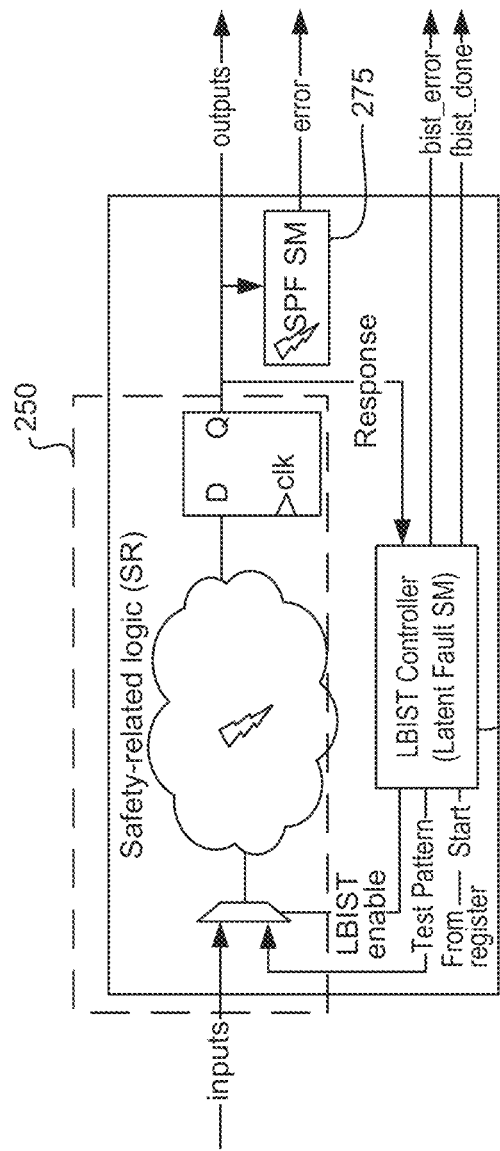
FIG. 1
FIG. 2

Table I

| Source instance | Source instance output Port | Destination instance name | Destination instance input port name | Via points during path traversal Between source and destination | Safety mechanism ID | Via point connected to safety mechanism |
|---|---|---|---|---|---|---|
| U1 | S1 | U3 | D1 | Via1, Via3, Via4, Via7, Via8, Via15 | SM1 | Via1, Via3, Via4, Via7, Via8, Via15 |
| U1 | S1 | U3 | D1 | Via1, Via3, Via4, Via7, Via8, Via15 | SM2 | Via1 |
| U1 | S1 | U4 | D2 | Via1, Via6, Via9, Via10, Via12, Via16 | SM1 | Via1 |
| U1 | S1 | U3 | D2 | Via1, Via6, Via9, Via10, Via12, Via16 | SM2 | Via1, Via6, Via9, Via10, Via12, Via16 |
| U2 | S2 | U3 | D3 | Via2, Via5, Via13, Via14, Via11 | - | - |

*FIG. 6*

Table II

| Via Point Port | Safety Mechanism ID tapping the via point | Source and Destination Pair List | Safety Criticality |
|---|---|---|---|
| Via1 | SM1, SM2 | <U1:U3>, <U1:U4> | SM_DET, LF_SM |
| Via2 | none | <U2:U5> | NO_SM |
| Via 3 | SM1, SM3 | <U1:U3> | SM_DET, LF_SM |

*FIG. 7*

IDENTIFYING ASSOCIATION OF SAFETY RELATED PORTS TO THEIR SAFETY MECHANISMS THROUGH STRUCTURAL ANALYSIS

RELATED APPLICATION

The present application claims benefit under 35 USC 119(e) of U.S. Patent Application No. 63/193,485, filed May 26, 2021, the content of which is incorporated herein by reference in its entirety.

TECHNICAL FIELD

The present application relates to integrated circuits, and more particularly to detecting faults in integrated circuits.

BACKGROUND

Safety related logic blocks disposed in an integrated circuit (IC) are hierarchical designs that may have multiple sub-blocks interacting with each other. Intellectual Property (IP) blocks designed to perform a specific function may be integrated into larger components called System on Chip (SoC). Within the IP blocks, there are often internal safety mechanisms that monitor the activities of the safety related logic blocks in order to check and report occurrence of any faults that may occur in such blocks.

To collect data related to various functional safety related issues, a Design Failure Mode Effects and Analysis (DFMEA) or Fault Tree Analysis (FTA) may be conducted. The DFMEA includes a number of steps, such as capturing the various failure modes in the IC design, and determining and/or reporting what the effect of each failure mode is. The DFMEA is performed at a hardware module (subpart) level to check for safety concerns at different levels of hierarchy.

SUMMARY

A method of verifying safety in a circuit design, in accordance with one embodiment of the present disclosure, includes, in part, receiving data representative of the circuit design; identifying a first safety mechanism within the circuit design where the safety mechanism is represented by a first module within the circuit design and has an output port defining a first diagnostic point; identifying a multitude of ports of a second module within the circuit design; determining whether at least one port of the second module is associated with a safety concern; performing, by a processor, a backward path tracing from the first diagnostic point to determine if the port falls within a cone of influence of the first safety mechanism; and establishing that a potential fault appearing at the port is detectable at the first diagnostic point if the port is determined to fall within the cone of influence of the first safety mechanism.

In one embodiment, the method further includes, in part, determining whether at least a second port of the second module is not associated with a safety concern. In one embodiment, the method further includes, in part, identifying a second safety mechanism within the circuit design, where the second safety mechanism is disposed within the second module and has an output port defining a second diagnostic point; performing a backward tracing from the second diagnostic point to determine if the first port falls within a cone of influence of the second safety mechanism; and establishing that a potential fault appearing at the first ports is detectable at the second diagnostic point if the first port is determined to fall within the cone of influence of the second safety mechanism.

In one embodiment, the first module is disposed in a first hierarchy of the circuit design different from a second hierarchy of the circuit design in which the second module is disposed. In one embodiment, the second module is an intellectual property (IP) module. In one embodiment, the first and second modules are the same module.

A method of verifying safety in a circuit design, in accordance with one embodiment of the present disclosure, includes, in part, receiving data representative of the circuit design; identifying a multitude of ports of a first module within the circuit design; determining whether at least one port of the first module is associated with a safety concern; identifying a first safety mechanism within the circuit design where the safety mechanism is represented by a second module within the circuit design and has an output port defining a first diagnostic point; performing by a processor a forward path tracing from the first port to determine if the first port leads to the first safety mechanism; and establishing that a potential fault appearing at the first port is detectable at the first diagnostic point if the first port is determined to lead to the first safety mechanism.

In one embodiment, the method further includes, in part, determining whether at least a second port of the first module is not associated with a safety concern. In one embodiment, the method further includes, in part, identifying a second safety mechanism within the circuit design where the second safety mechanism is disposed in the first module and has an output port defining a second diagnostic point; performing a forward path tracing from the first port to determine if the first ports leads to the second safety mechanism; and establishing that a potential fault appearing at the first port is detectable at the second diagnostic point if the first port is determined to lead to the second safety mechanism.

In one embodiment, the first module is disposed in a first hierarchy of the circuit design different from a second hierarchy of the circuit design in which the second module is disposed signal. In one embodiment, the first module is an intellectual property (IP) module. In one embodiment, the first and second modules are the same module.

A system for verifying safety in a circuit design, in accordance with one embodiment of the present disclosure, includes, in part, a memory storing instructions; and a processor, coupled with the memory and to execute the instructions. The instructions when executed cause the processor to receive data representative of the circuit design; receive identification of a first safety mechanism within the circuit design where the safety mechanism is represented by a first module within the circuit design and has an output port defining a first diagnostic point; receive identification of a multitude of ports of a second module within the circuit design; receive indication that at least a first port of the second module is associated with a safety concern; perform a backward path tracing from the first diagnostic point to determine if the first ports falls within a cone of influence of the first safety mechanism; and establish that a potential fault appearing at the first port is detectable at the first diagnostic point if the first port is determined to fall within the cone of influence of the first safety mechanism.

In one embodiment, the processor is further configured to deduce that at least a second port of the second module is not associated with a safety concern. In one embodiment, the processor is further configured to identify a second safety mechanism within the circuit design where the second safety mechanism is disposed in the second module and has an output port defining a second diagnostic point; perform a backward tracing from the second diagnostic point to determine if the first port falls within a cone of influence of the second safety mechanism; and establish that a potential fault appearing at the first port is detectable at the second diagnostic point if the first port is determined to fall within the cone of influence of the second safety mechanism. In one embodiment, the first module is disposed in a first hierarchy of the circuit design different from a second hierarchy of the circuit design in which the second module is disposed.

A system for verifying a circuit design, in accordance with one embodiment of the present disclosure, includes a memory storing instructions; and a processor that is coupled with the memory to execute the instructions. The instructions when executed cause the processor to receive data representative of the circuit design; receive identification of a multitude of ports of a first module within the circuit design; receive indication that at least a first port of the first module is associated with a safety concern; receive identification of a first safety mechanism within the circuit design where the safety mechanism is represented by a second module disposed in the circuit design and has an output port defining a first diagnostic point; perform a forward path tracing to determine if the first port leads to the safety mechanism; and establish that a potential fault appearing at the first port is detectable at the first diagnostic point if the first port is determined to lead to the first safety mechanism.

In one embodiment, the processor is further configured to determine whether at least a second port of the first module is not associated with a safety concern. In one embodiment, the processor is further configured to deduce that a second safety mechanism is present, where the second safety mechanism is represented by a second module within the circuit design and has an output port defining a second diagnostic point; perform a forward path tracing to determine if the first port leads to the safety mechanism; and establish that a potential fault appearing at first port is detectable at the second diagnostic point if the first ports is determined to lead to the second safety mechanism. In one embodiment, the first module is disposed in a first hierarchy of the circuit design different from a second hierarchy of the circuit design in which the second module is disposed signal.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

FIG. 1 is a simplified high-level diagram of a logic design having a pair of logic blocks.

FIG. 2 is a simplified high-level block diagram of a logic having primary and secondary safety mechanisms.

FIG. 6 shows a Table I listing ports disposed between safety related blocks/modules detected through path tracing, in accordance with one embodiment of the present disclosure.

FIG. 7 shows a Table II displaying the associated safety mechanism list and the classification of the safety mechanisms of Table I.

DETAILED DESCRIPTION

Figure 3:
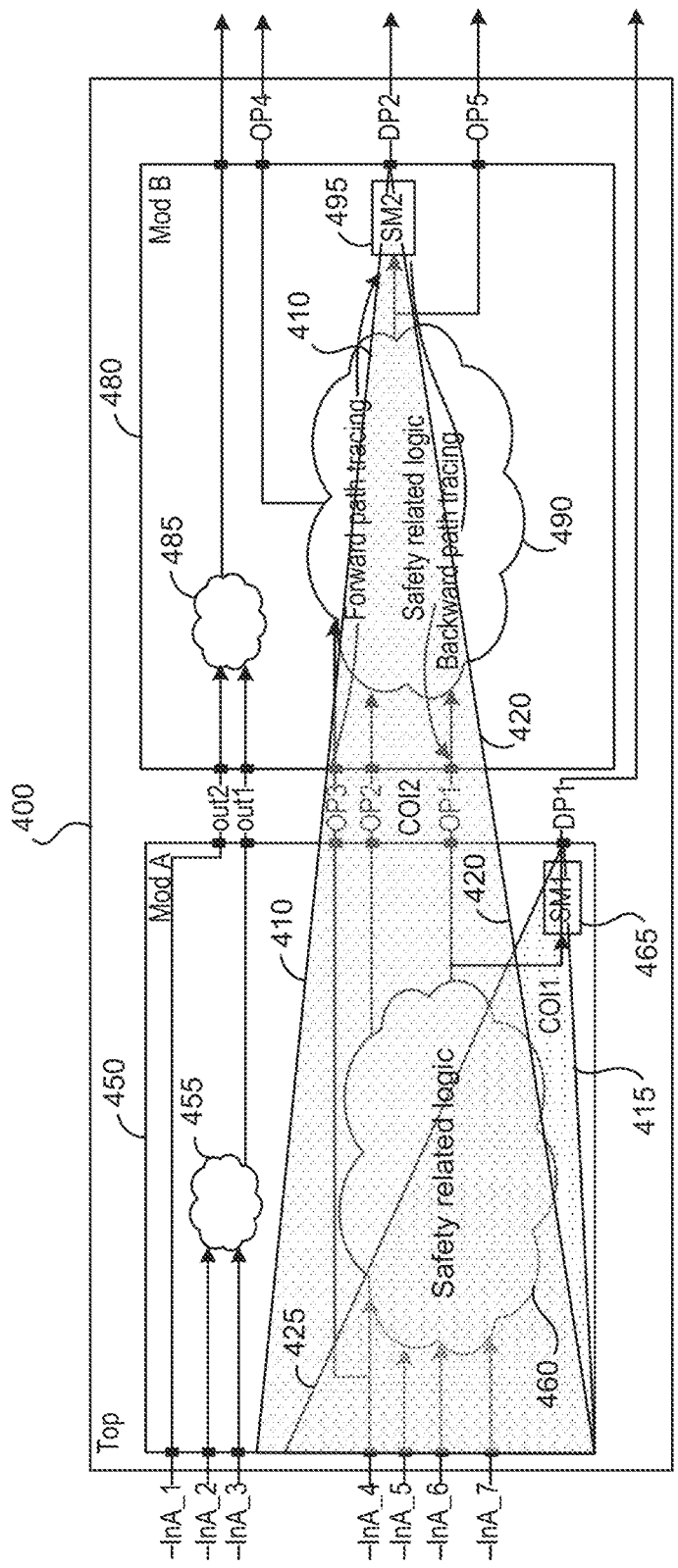
FIG. 3 is a simplified high-level block diagram of a logic having a pair of modules each including a safety mechanism, in accordance with one embodiment of the present disclosure.

Integrated circuits (ICs) and System-on-Chips (SoCs) are being increasingly used in products and applications that involve safety. For example, safety is an important consideration in an SoC designed for automotive applications.

In a modular design, the failure modes associated with a safety related logic (i.e., a logic block in which occurrence of a fault may affect safety) may be spread across several levels of hierarchies and sub-hierarchies that interact with each other. During such interactions, the ports of the modules relevant to safety related logic become observation points to the safety related transactions occurring in such ports. The ports across modules that are involved in the safety of a hardware are referred to herein as safety related ports. A reliable safety implementation ensures that all safety related ports are within the cone of influence of monitoring by one or more safety mechanisms.

In one technique, ports affecting safety are identified through the judgement of the IC designer or another individual who is familiar and associated with the design. In such techniques, the designer may specify a safety mechanism as being suitable to detect all faults (i.e., abnormal conditions that can cause an element or a block disposed an IC or an IC design to fail) causing failure within a cone. However, such judgments may fall short of accurately and exhaustively identifying the association between such ports and the safety mechanisms.

In another technique, path analysis is performed either through a tool based external script or simulation to determine if a deliberately injected fault is detected by the safety mechanism. However, performing an exhaustive path analysis is time consuming, effort intensive, and potentially inaccurate, particularly when the path of a safety related signal spans across multiple of levels hierarchy. Furthermore, in trying to justify the result of the path analysis to a safety assessor (such as ISO 26262), there may be no viable traceable evidence of how the identification of safety related ports could have been determined.

In accordance with one embodiment of the present disclosure, association between a safety related port and its designated safety mechanism is evaluated through structural design analysis and forward/backward path analysis. Embodiments of the present disclosure therefore avoid limitations of a manual analysis. In accordance with another embodiment, safety related ports that are in the cone of influence of a secondary safety are also identified. Furthermore, absence of safety related ports that are in the cone of influence of a safety mechanism is also identified.

Embodiments of the present disclosure achieve a number of advantages. In complex designs, where path traceability is not humanly possible, an algorithm-based path analysis tool may be used to increase the speed and accuracy of the analysis. Embodiment of the present disclosure, by using the actual paths to confirm the association of safety related port to their associated safety mechanisms, dispense the need for human judgements on whether a port is safety related. Embodiments of the present disclosure, advantageously identify additional secondary safety mechanisms through path analysis when the associated logic blocks branch out via other paths. Embodiments of the present disclosure are accurate, fast and provide path visibility associated with built-in safety required by relevant safety standards.

FIG. 1 is a simplified high-level diagram of a pair of logic blocks 100 and 150 showing the relationship between a safety related logic and a safety mechanism, to aid in understanding embodiments of the present disclosure. The term "safety" may refer to an absence of unacceptable risk within an integrated circuit (IC) or an IC design. The term "safety related logic" may refer one or more logic blocks in which occurrence of a fault may affect safety. The term "safety mechanism" may refer to an operation or function performed by an element, block or component of an IC or an IC design configured to detect, mitigate or tolerate faults, or control or avoid failures in order to maintain the intended functionality, or achieve or maintain a safe state. In other words, a safety mechanism may be implemented by one or more logic blocks designed to detect and report faults within the IC or IC design. A "primary safety mechanism" may be a mechanism designated to detect faults associated with a safety related logic. A secondary safety mechanism may be an alternate safety mechanism that can also detect some of the faults in and left out by the primary safety mechanism's cone of influence. The term "failure" may refer to the termination of an intended behavior of a safety related logic block within an IC or an IC design due to a fault that violates a safety related goal. The term "cone of influence" may refer to the visibility attributed to a given safety mechanism, where the visibility includes safety related logic, and ports that a diagnostic point of the safety mechanism may be able to observe, detect, or correct when a fault occurs at such safety related ports. In other words, a cone of influence may be determined by backward tracing a path from a safety mechanism diagnostic point as the apex point to one or more input signals of a given element based on the connectivity between the logic elements and the ports, component, or block of the IC or IC design, and identifying all ports along the path. The identified ports within the cone of influence may be derived from the cone of influence of the safety mechanism diagnostic point.

Because logic block 100 may be used in applications that have considerable safety implications, such as the brake operation of a vehicle, any faults in the operation of logic block 100 is ideally detected and corrected for. Logic block 100, which is a safety-related logic (SR) as defined above, is shown as including combinatorial logic gates 10, 12, 14, 16, and sequential logic gate 20. The output signal of logic gate 20 may be observed at observation point OP1. A fault that occurs withing SR 100 is observable at OP1. An "observation point" refers to an output signal of an element, block or component of an IC or an IC design at which point the potential effect of a fault may be observed. In other words, an observation point may refer to a point at which an effect of a fault may be observable. An observation point may also be referred to herein as a safety related port.

Logic block 150, along with logic gates 30 and 35, receives data present at the output of sequential logic gate 20 as well as data received via port par_in and generates a signal at the output port of logic gate 35, which is shown as being a diagnostic point DP1. A "diagnostic point" may refer to an output signal of a safety related logic within an IC or IC design at which point the detection or correction of a fault is reported. In other words, a diagnostic point is a point at which an output of a safety mechanism can confirm a fault detection. Logic block 150, which is a safety mechanism (SM) as defined above, is adapted to monitor the observation point OP1 for occurrence of a fault.

In FIG. 1, a parity bit received via signal par_in is used by SM 200 to detect faults in the bit pattern present in the data carried by signal rd_data_in. To detect such faults, compare logic gate 35 compares the parity bit received via signal par_in with the parity bit data deduced from XOR gate 30. A mismatch between the parity bits received by compare logic 35 is an indication of a fault at DP1. In other words, when a fault is detected by SM 200, the signal at DP1 is asserted. It is understood that while the fault is observable at OP1, during the normal operation of the IC, any possible defect is detected at DP1 and relayed, for example, by way of an interrupt signal to a controller, such as a central processing unit (CPU), to take corrective action.

If SM 200 fails to operate properly and thus fails to detect a fault that may occur at SR 100, then the fault becomes latent. Accordingly, a secondary safety mechanism, also referred to herein as a secondary SM, may be used.

FIG. 2 is a simplified high-level block diagram of an SR 250, primary SM block 275, and secondary SM block 285. A fault occurring within SR 250 if undetected by primary SM 275, is ideally detected by secondary SM 285, which is shown as being a logic built-in self-test (LBIST) controller.

One measure of confidence during safety analysis of an integrated circuit design is a determination as to whether each safety related port of all safety related logic blocks is in the cone of influence of at least one safety mechanism. For example, an analysis may indicate the presence of a path from a safety related port to a diagnostic point of a safety mechanism. In another example, a safety related ports analysis may also include identifying additional safety mechanisms that can be utilized if a designated safety mechanism fails to operate properly.

The safety analysis aids in determining whether a safety related port is in the cone of influence of a safety mechanism, whether there are one or more secondary safety mechanisms for a safety related port, whether there are safety related ports that are undetectable by any safety mechanism within the IC or IC design, and whether there are ports that are not intended to be safety related but that are in the cone of influence of a safety mechanism.

One aspect of analyzing safety related issues in a hierarchical logic design involves identifying which ports in a sub-module or the top-level module of the design may affect safety. Any such port is ideally monitored by one or more safety mechanisms to ensure any fault in such ports is detected by a safety mechanism and reported to the next level logic or the system for corrective actions to be taken before the fault translates into a failure.

In accordance with one embodiment of the present disclosure, association between a safety related port and its designated safety mechanism is evaluated through structural design analysis and forward/backward path analysis. Embodiments of the present disclosure therefore avoid limitations of a manual analysis. In accordance with another embodiment, safety related ports that are in the cone of influence of a secondary safety are also identified. Furthermore, absence of safety related ports that are in the cone of influence of a safety mechanism is also identified.

Embodiments of the present disclosure achieve a number of advantages. In complex designs, where path traceability is not humanly possible, an algorithm based path analysis tool may be used to increase the speed and accuracy of the analysis. Embodiment of the present disclosure, by using the actual paths to confirm the association of safety related port to their associated safety mechanisms dispense the need for human judgements on whether a port is safety related. Embodiments of the present disclosure advantageously identify additional secondary safety mechanisms through path analysis when the associated logic blocks branch out via other paths. Embodiments of the present disclosure are accurate, fast and provide path visibility associated with built-in safety required by relevant safety standards.

FIG. 3 is a simplified high-level diagram of a logic block 400 shown as including, in part, module (Mod) A 450, and module B 480. Module 450 is shown as including, non-SR logic cloud (i.e., collection of logic elements, components or submodules) 455, an SR logic cloud 460, and a SM block 465. Module 480 is shown as including a non-SR logic cloud 485, an SR logic cloud 490, and a SM block 495.

Non-SR logic cloud 455 of module 450 is shown as receiving input signals InA_2, InA_3 and generating output signal out1 that is received by non-SR logic cloud 485 of module 480. Faults occurring withing non-SR logic clouds 455 and 485 do not cause safety violations and thus are not of concern.

Module 450 is also shown as receiving, in part, input signals InA_4, InA_5, InA_6, and InA_7, and generating signals OP1, OP2, OP3, and DP1. Module 480 is shown as receiving, in part, signals OP1, OP2, OP3 and generating signals OP4, OP5 and DP2. The ports carrying signals OP1, OP2, OP3, OP4, OP5 are observation points, and the ports carrying signals DP1, and DP2 are diagnostic points. Observation points are ports where the effects of a failure can be observed. Diagnostic points are outputs of a safety mechanism logic which indicate whether the safety mechanism detected a fault.

In accordance with one embodiment of the present disclosure, backward path tracing is performed to determine if signals OP1, OP2 and OP3 are in the cone of influence of SM block 495 disposed in module 480. Backward path tracing involves tracing the physical connections between the gates based on their connectivity. The output of a gate can be traced back to its inputs, and further traceback identifies the gates connected to such inputs, and the like. Such traceback continues until its module hierarchy boundary inputs are reached, as, for example, in the backward path tracing from OP2 terminating at inputs of module 450. In some cases, the traceback can transcend the sub-modules based on their connectivity, and may extend to the top of the module, such as module 400. If such backward path tracing shows that a path exists between input ports OP1, OP2 and OP3 and SM block 495, then a determination is made that SM block 495 can detect possible defects that may appear at observation points OP1, OP2 and OP3 and the logic in between via diagnostic point DP2.

As is seen from FIG. 3 the cone of influence of SM 495, shown by boundary lines 410 and 420, may be further traced backward, in accordance with embodiments of the present disclosure, to determine if it encompasses any of the input ports InA_4, InA_5, InA_6, and/or InA_7 of module 450. If such a backward path tracing shows that any of the input ports InA_4, InA_5, InA_6, and/or InA_7 of module 450 falls within the cone of influence of SM 495, then a determination is made that any fault occurring on any of these input ports and the logic in between may also be detected by SM 495 at diagnostic point DP2.

A similar backward path tracing may also be performed to determine if the cone of influence of SM 465 encompasses one or more of input ports InA_4, InA_5, InA_6, and/or InA_7. In FIG. 3, input ports InA_4, InA_5, InA_6, and/or InA_7 are shown as falling within the cone of influence of SM 465 which is defined by boundary lines 415 and 425. Accordingly, any fault that may appear at input ports InA_4, InA_5, InA_6, InA_7 can also be detected at diagnostic point DP1. Therefore, the backward path analysis, in accordance with one embodiment of the present disclosure, identifies that a fault occurring at any of the input ports InA_4, InA_5, InA_6, InA_7 that may not get detected by SM 495 due, for example, to a fault in SM 495, can be detected at SM 465. In other words, the backward path tracing identifies redundancy in detecting faults at input ports of a logic block.

In accordance with some embodiments of the present disclosure, forward path tracing is performed to determine if a potential fault at one or more ports of a safety related logic are detectable at a safety mechanism. Forward path tracing involves tracing the physical connections between the gates based on their connectivity. The inputs of a gate are traced to its outputs, and further forward trace identifies the output of the gates that are connected to inputs of other gates, and the like. The forward tracing continues until the module hierarchy boundary outputs are reached, as shown, for example, in the forward tracing of InA_5 reaching to either OP1 or OP2 in module 450. In some cases, the forward tracing can transcend the sub-modules modules based on the connectivity, and may extend to the top of the module, such as module 400. Referring, for example, to FIG. 3, a designer or a user may be interested in determining whether a fault at a port of interest, such as input port InA_4 is detectable at SM 465. To achieve this, the forward path tracing is used to determine whether a path exists between input port InA_4 and SM 465. If a path is determined to exist, then the designer/user knows that SM 465 can detect potential faults at input port InA_4. Such a tracing algorithm can be incorporated in a tool to perform backward and/or forward path tracing.

Examples of attributes of safety related ports include (1) single output as a source that can fan-in to inputs of multiple modules as destinations; (2) the path of logic that traverses through such ports and either originates or ends in a safety related logic; or (3) the path of logic involves several modules across multiple hierarchies. Each safety related port is ideally in a cone of influence of a safety mechanism. As described above, in some embodiments, there may be more than one safety mechanism monitoring the same port, thereby adding redundancy to the detection of fault potentially by more than one safety mechanism. In one embodiment, the results of the path tracing may include, the source module, the source module output ports(s), the destination module, the destination module output port(s), and the safety mechanism(s).

When several modules or sub-modules of a design interact with one another, there may be many permutations of paths that cross over between the modules and/or sub-modules. Such paths may include flip-flops that can affect the analysis of traversal in branching in and out from the output of the flip-flops. When safety related ports/signals pass through the ports of a module, the safety related ports are identified to ensure that they are within the cone of influence of a safety mechanism in order to detect any fault occurring on such ports. Some embodiments of the present disclosure may be implemented using various IC design diagnostics, automated test pattern generation (ATPG), or functional safety tool (e.g., such as TestMAX-FuSa®).

As described above, in some embodiments, the association between a safety mechanism and the safety related port is performed based on a backward path tracing (propagation) analysis. In the backward path analysis, safety related ports that fall within the cone of influence of a safety mechanism are identified. Also, the analysis includes running a path check via forward path tracing to capture safety related ports present in between blocks of the IC design. In accordance with embodiments of the present disclosure, a software tool performs the various tasks related to evaluating the existence of paths between the safety related ports and the safety mechanisms via forward and backward path tracing, and generates a report of the results.

Embodiment of the present disclosure provide a number of advantages. For example, embodiments of the present disclosure provide easy syntax for the user to specify parameters and inputs such as observation points, safety mechanisms and their diagnostic point, the start and end blocks for analysis of connectivity between safety mechanisms and related ports. Embodiment of the present disclosure are adapted to generate a cone of influence from a safety mechanism diagnostic point. Embodiment of the present disclosure are adapted to trace the cone of influence starting from a diagnostic point of a safety mechanism all the way to the safety related ports, and transcend across hierarchies, sub-hierarchies and submodule elements ports and flip-flops. Embodiment of the present disclosure provide forward tracing from the safety related ports present in between blocks of the IC design to any safety mechanism. Embodiment of the present disclosure provide an easy syntax to configure the tool's features. Embodiment of the present disclosure provide a user-friendly, tabulated report at the end of the analysis.

In some embodiments, a user may provide, via interaction with a user interface, the details about observation point, safety mechanism and the diagnostic points. It is understood that while embodiments described herein provide implementation details involving receipt of the aforementioned parameters from the user before performing a cone of influence or other analysis, various embodiments may involve automatic identification of such parameters without input from the user. Automatic detection and association of the safety related ports to any safety mechanism render the IC design process more robust.

Figure 4:
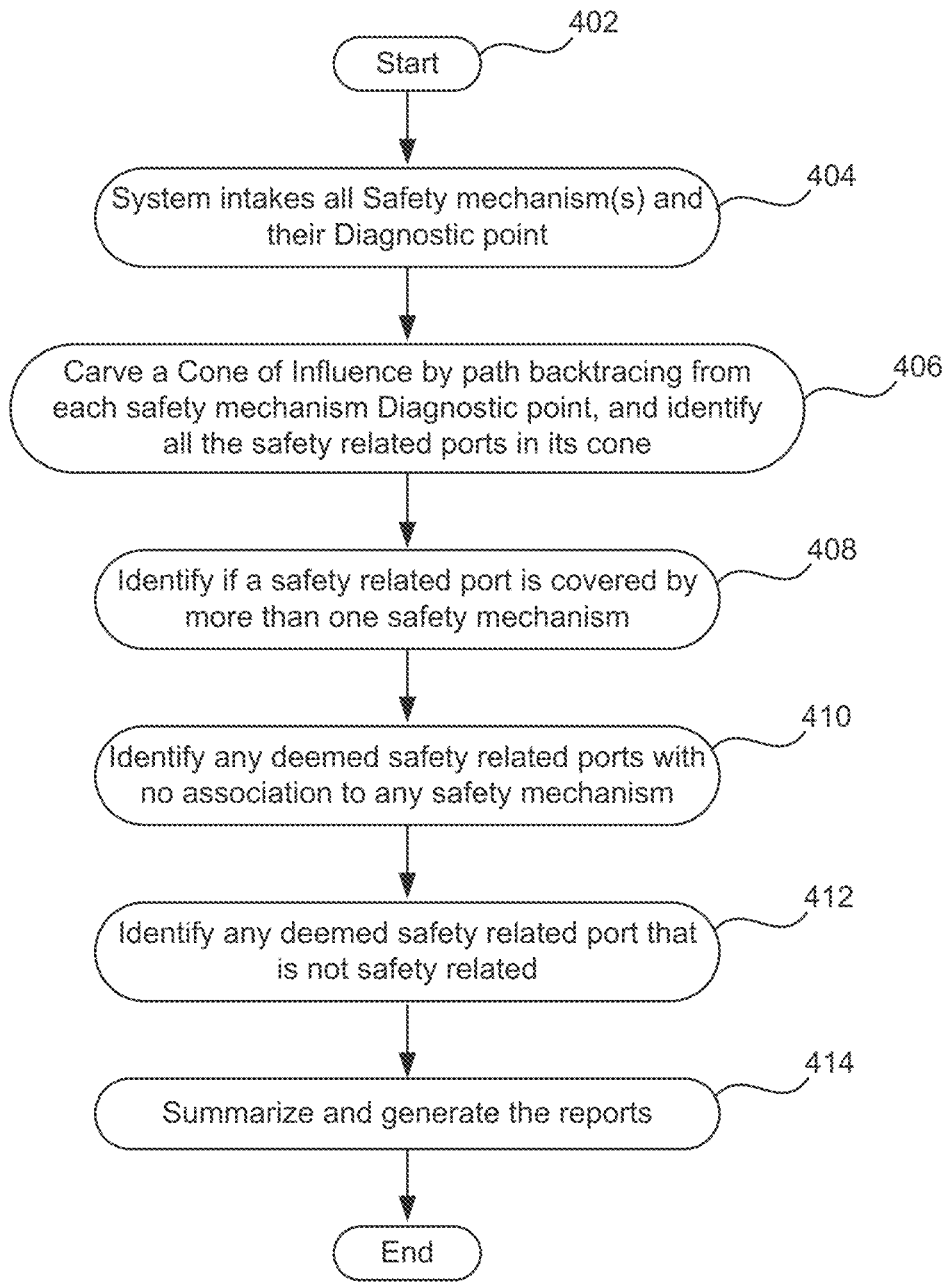
FIG. 4 is a flow diagram for performing backward path tracing in order to determine association(s) between a safety mechanism and one or more safety related ports, in accordance with one embodiment of the present disclosure.

FIG. 4 is a flow diagram 400 for performing backward path tracing in order to determine association(s) between safety mechanisms and safety related ports, in accordance with one embodiment of the present disclosure.

At 402, the analysis starts. At 404, a user (e.g., a user or a safety engineer, or a person associated with the circuit) identifies and supplies to the tool information about all safety mechanisms and their diagnostic points. At 406, the paths of the cone of influence with the safety mechanism's diagnostic points as the apex, are traced back to identify all safety related ports in the cone of influence. At 408, safety related ports that fall within the cones of influence of more than one safety mechanism are identified as described in 406. Such ports may span across hierarchies. At 410, safety related ports that was deemed safety related and that do not fall within the cone of influence of any safety mechanism and thus have no association with any safety mechanism are identified. At 412 any port that is initially deemed as a safety related port but is subsequently determined not to be a safety related port is identified. At 414, the result of the analysis obtained from flowchart 400 is provided in a report. At 416 the process shown in flowchart 400 ends.

Figure 5:
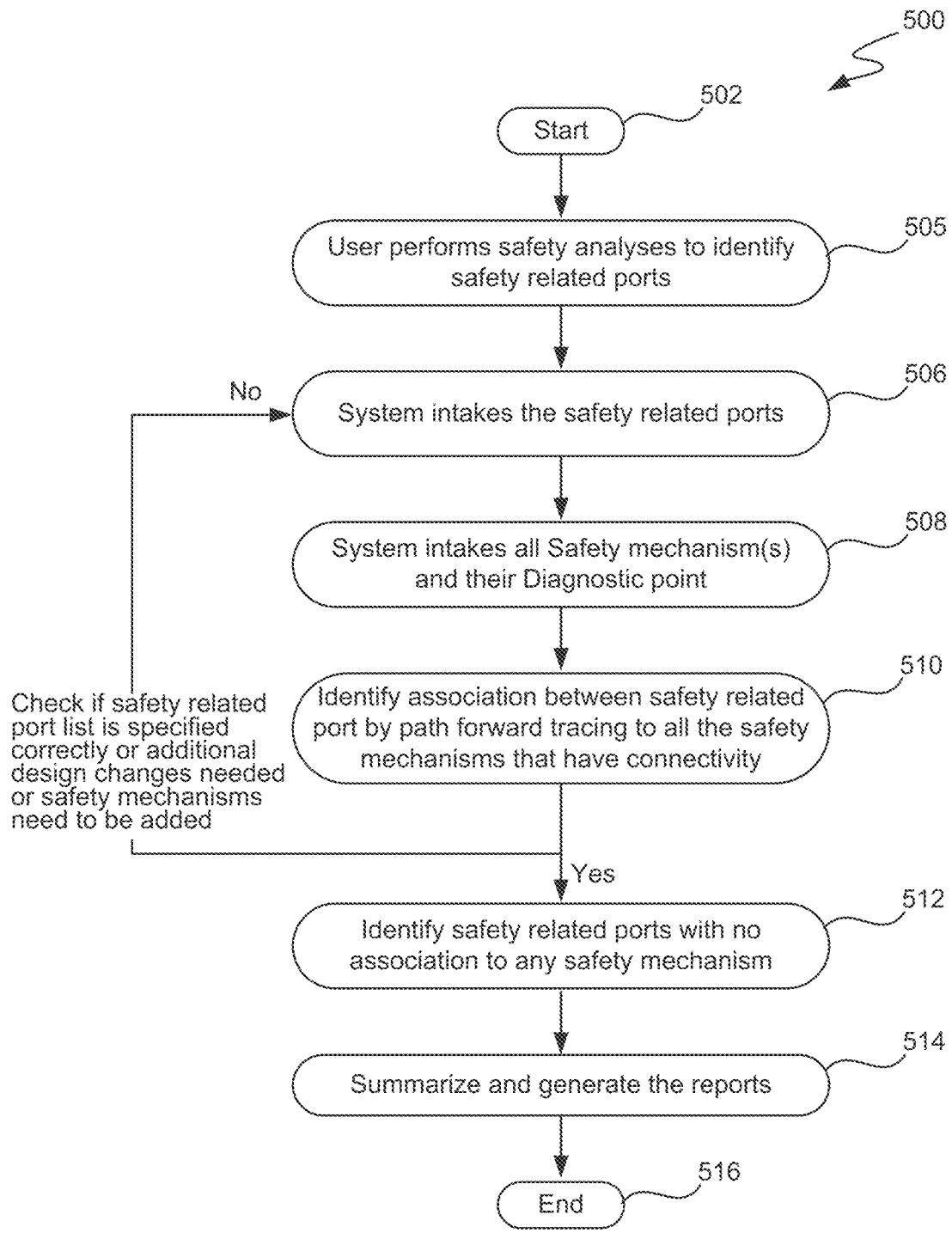
FIG. 5 is a flow diagram for performing forward path tracing in order to determine association(s) between safety related ports and one or more safety mechanisms, in accordance with one embodiment of the present disclosure.

FIG. 5 is a flow diagram 500 for performing forward path tracing in order to determine association(s) between safety related ports and one or more safety mechanisms, in accordance with one embodiment of the present disclosure.

At 502, the analysis starts. At 504, a user (e.g., a designer, a safety engineer) performs safety analysis to identify safety related ports. At 506, the user supplies to the tool information about the safety related ports. At 508, the system receives information about all safety mechanisms and their diagnostic points. At 510, forward path tracing is performed to identify association(s) between the safety related ports specified in 506 and the safety mechanisms specified in 508. Such an association is determined by finding connectivity between the safety related ports and the safety mechanisms through forward path tracing. If at 510 further checks show that (i) safety related ports are not correctly specified in 506, or (ii) additional design changes are required, or (iii) additional safety mechanism need to be added to the design, the process moves back to 506. If at 510 further checks show that (i) safety related ports are correctly identified, and (ii) no additional design changes are required, and (iii) no additional safety mechanism need to be added to the design, the process moves to 512, at which point safety related ports that have no association with any safety mechanism are identified. At 514, the result of the analysis obtained from flowchart 500 is provided in a report. At 516 the process ends.

In one embodiment, a probabilistic analysis may also be involved in the path tracing that can predict which paths are enabled paths and which paths are not enabled paths by calculating the probability that a given node will be at a logic zero or at a logic one. Enabled paths are paths that are enabled based on the state of inputs to logic gates within a connected path. If a state of a gate is such that it enables the transfer of state to a next gate, the gate is an enabling gate. For example, an input value of 1 to an OR gate enables the path associated with the OR gate. An input value of 0 to an AND gate disables the path associated with the AND gate. In one embodiment, a probabilistic analysis is performed on the gates in a path to dynamically determine which of the gates enable transfer of data path. In one embodiment, the probabilities associated with the logic setting on the inputs or nodes of the cells can be specified by the designer as a constraint. In accordance with such probabilistic analysis, the probability of receiving a logic zero or one at a node is calculated and used in the path tracing analysis. For example, in AND gate, if the probability is biased towards a zero then the probability of a non-zero value propagating through other inputs reduces.

As described above, all safety related ports should be associated with at least one safety mechanism by being in the cone of influence of the safety mechanism's diagnostic point. However, if there are safety related ports that remain unassociated with any safety mechanism, such ports are identified (e.g., by way of user report or other electronic notification) to the designer/user, as shown in flowcharts 400 and 500. The designer/user may then analyze the design to establish whether any safety related port that is not in any safety mechanisms' cone of influence is in fact a safety related port or not. If such a port is determined not to be a safety related port, then it can be designated as a SAFE port. For example, referring to FIG. 3, ports out1 and out2, are determined as not being safety related ports and, accordingly, as they are not in the cone of influence of safety mechanism 495, they are considered safe ports and designated as SAFE.

Alternatively, there may be ports that are within the cone of influence of a safety mechanism but are not designated as safety related ports during the failure modes analysis in 504. Ports that are within a safety mechanism's cone of influence but not identified as safety related ports may be designated as NO_OP. For example, referring to FIG. 3, assume port OP3 is not designated as a safety related port. Since OP3 is within the cone of influence (COI) of SM 495, the lack of designation of OP3 as a safety related port will be brought to the attention of the designer/user. The designer/user may then augment the list of safety related ports to designate OP3 as either a SAFE port or a NO_OP port. Such identification may be reevaluated to ensure that any refinement is accounted for so that all safety related ports are consistently designated between what is specified by the user and what is auto-detected using the safety mechanism's cone of influence via path back tracing algorithm.

A safety mechanism may be designated as a primary safety mechanism for a number of ports. For example, referring to FIG. 3, ports InA_4, InA_5, InA_6 and InA_7 may be associated with SM 465 as their primary safety mechanism, and ports OP2 and OP3 may be associated with SM 495 as their primary safety mechanism. Safety related ports having association with a primary safety mechanism may be designated SM_DET. Furthermore, a safety related port that has no association with any safety mechanism may be designated as NO_SM. A safety related port having association to a secondary safety mechanism may be designated as LF_SM.

The association between safety related ports and the safety mechanisms may be completed and identified using designations SM_DET, NO_SM and/or LF_SM, as described above. Following the completion of the analysis, in accordance with embodiments of the present disclosure, no NO_OP designations should remain.

Exemplary Table I shown in FIG. 6, and generated in accordance with embodiments of the present disclosure, lists the ports disposed between safety related blocks/modules as detected through path tracing. Table II, shown in FIG. 7, displays the associated safety mechanism list and the classification of the safety mechanism. In Table II, column heading "Via point port" includes a list of port names across hierarchical boundaries that are detected during the forward path tracing. Column heading "Safety mechanism ID tapping via point" includes a list of all safety mechanism IDs associated with the ports shown in the first column. Column heading "Source and Destination pair list" includes a list of all the pair of source and destination modules between which the ports shown in column 1 were detected. Column heading "Safety Criticality" includes a listing of the safety designations.

The detailed data captured in designating the safety related ports as, SM_DET, NO_SM or LF_SM are thereafter translated to a suitable syntax for use by a tool that can map the collected data to the design hierarchy elements. After the user specifies the inputs, the tool performs forward and backward path tracing, followed by mapping and segregation (designation) of the safety related ports within the cone of influence of the safety mechanism. The report generated by the tool may include details, such as, the safety related port for each block instance; primary safety mechanism and its diagnostic point; secondary safety mechanism(s) and its diagnostic point; the ports that were traversed across various hierarchies to indicate how close or far they may be from the safety mechanism; and classification of whether a safety related port is designated as, SM_DET, NO_SM or LF_SM. It is understood that a similar analysis may be performed for any fault location within the safety related logic, as is done for ports in identifying the relationships between a fault location(s) and a safety mechanism(s).

Figure 8:
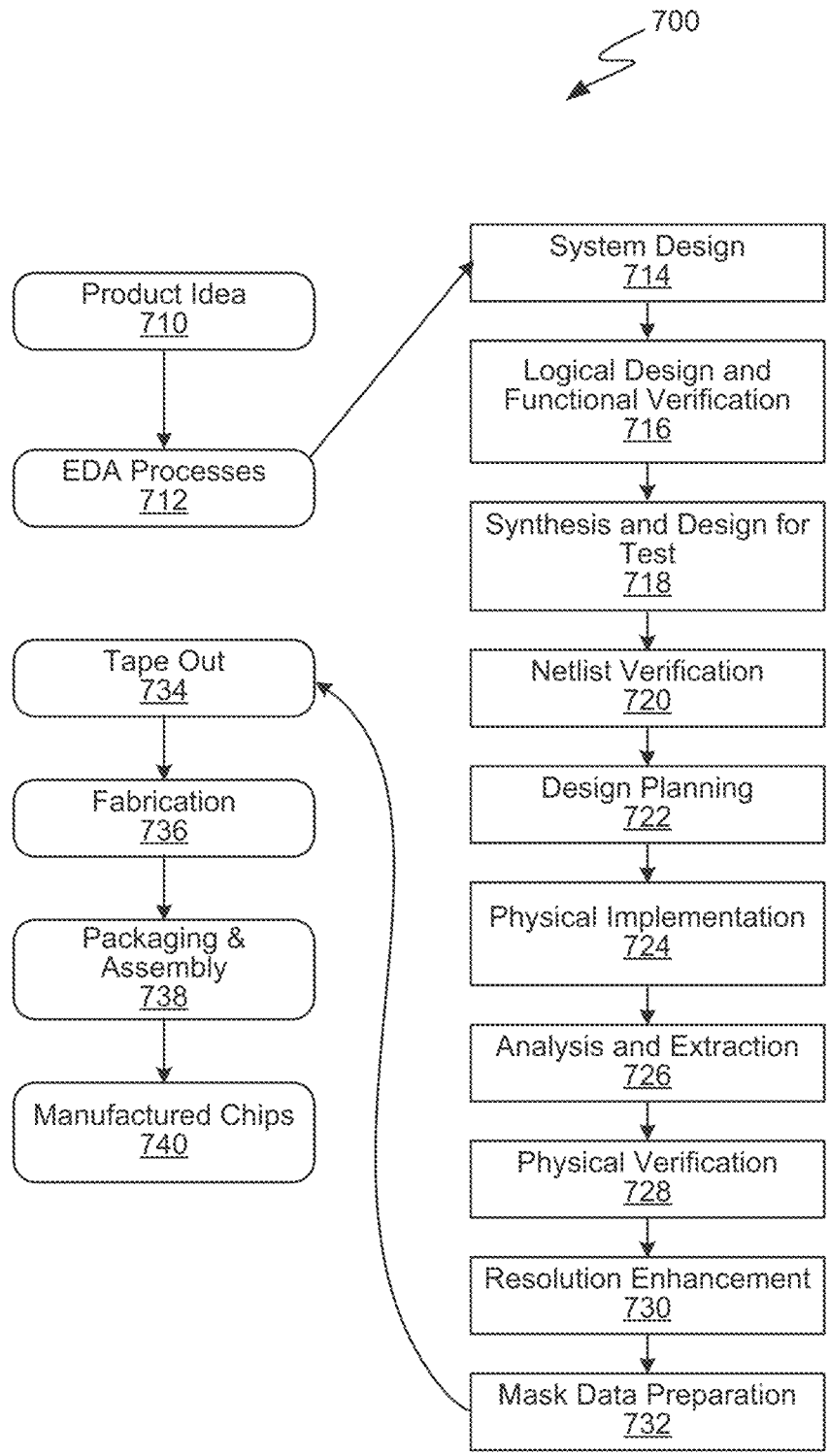
FIG. 8 depicts a flowchart of various processes used during the design and manufacture of an integrated circuit in accordance with some embodiments of the present disclosure.

FIG. 8 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 8. The processes described by be enabled by EDA products (or EDA systems).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 900 of FIG. 9) may be used to store the programs and data structures that are used by some or all of the EDA products described herein, and products used for development of cells for the library and for physical and logical design that use the library.

Figure 9:
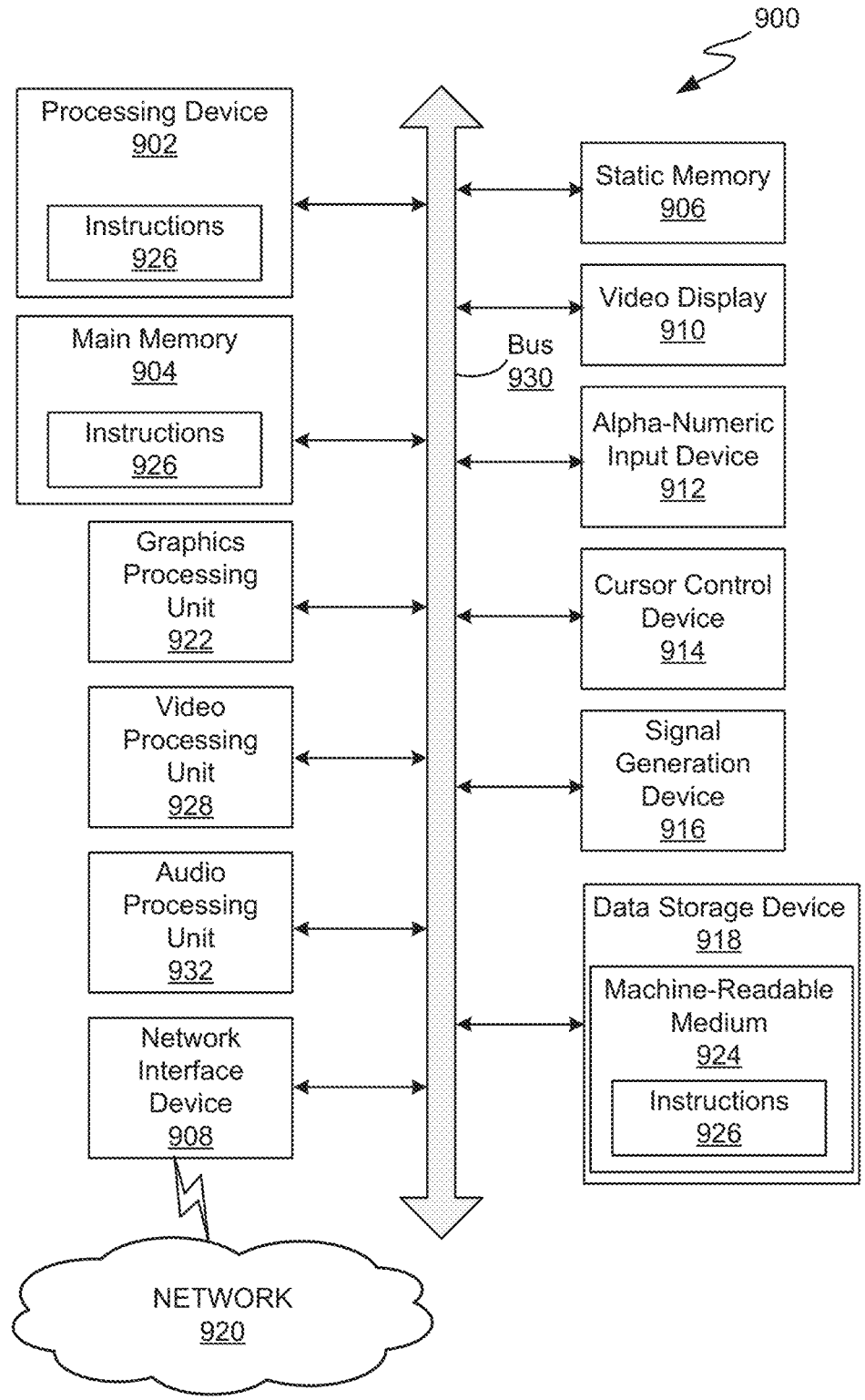
FIG. 9 depicts a diagram of an example computer system in which embodiments of the present disclosure may operate.

FIG. 9 illustrates an example machine of a computer system 900 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM), a static memory 906 (e.g., flash memory, static random access memory (SRAM), etc.), and a data storage device 918, which communicate with each other via a bus 930.

Processing device 902 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 may also be one or more special-purpose processing devices such as an application specific integrated circuit (ASIC), a field programmable gate array (FPGA), a digital signal processor (DSP), network processor, or the like. The processing device 902 may be configured to execute instructions 926 for performing the operations and steps described herein.

The computer system 900 may further include a network interface device 908 to communicate over the network 920. The computer system 900 also may include a video display unit 910 (e.g., a liquid crystal display (LCD) or a cathode ray tube (CRT)), an alphanumeric input device 912 (e.g., a keyboard), a cursor control device 914 (e.g., a mouse), a graphics processing unit 922, a signal generation device 916 (e.g., a speaker), graphics processing unit 922, video processing unit 928, and audio processing unit 932.

The data storage device 918 may include a machine-readable storage medium 924 (also known as a non-transitory computer-readable medium) on which is stored one or more sets of instructions 926 or software embodying any one or more of the methodologies or functions described herein. The instructions 926 may also reside, completely or at least partially, within the main memory 904 and/or within the processing device 902 during execution thereof by the computer system 900, the main memory 904 and the processing device 902 also constituting machine-readable storage media.

In some implementations, the instructions 926 include instructions to implement functionality corresponding to the present disclosure. While the machine-readable storage medium 924 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 902 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

The invention claimed is:

1. A method of verifying safety in a circuit design, the method comprising:
   receiving data representative of the circuit design;
   identifying a first safety mechanism within the circuit design, said safety mechanism represented by a first module within the circuit design and having an output port defining a first diagnostic point;
   identifying a plurality of ports of a second module within the circuit design;
   determining whether at least a first one of the plurality of ports of the second module is associated with a safety concern;
   performing, by a processor, a backward path tracing from the first diagnostic point to determine if the at least first one of the plurality of ports falls within a cone of influence of the first safety mechanism; and
   establishing that a potential fault appearing at the at least first one of the plurality of ports is detectable at the first diagnostic point if the at least first one of the plurality of ports is determined to fall within the cone of influence of the first safety mechanism.

2. The method of claim 1 further comprising:
   determining whether at least a second one of the plurality of ports of the second module is not associated with a safety concern.

3. The method of claim 1 further comprising:
   identifying a second safety mechanism within the circuit design, said second safety mechanism disposed within the second module and having an output port defining a second diagnostic point;
   performing a backward tracing from the second diagnostic point to determine if the at least first one of the plurality of ports falls within a cone of influence of the second safety mechanism; and
   establishing that a potential fault appearing at the at least first one of the plurality of ports is detectable at the second diagnostic point if the at least first one of the plurality of ports is determined to fall within the cone of influence of the second safety mechanism.

4. The method of claim 3 wherein the first module is disposed in a first hierarchy of the circuit design different from a second hierarchy of the circuit design in which the second module is disposed.

5. The method of claim 1 wherein the second module is an intellectual property (IP) module.

6. The method of claim 1 wherein the first and second modules are a same module.

7. The method of claim 1 further comprising:
   computing a probability that a node disposed in the path being traced receives a logic 0 or a logic 1; and
   using the probability in performing the backward path tracing.

8. A method of verifying safety in a circuit design, the method comprising:
   receiving data representative of the circuit design;
   identifying a plurality of ports of a first module within the circuit design;

determining whether at least a first one of the plurality of ports of the first module is associated with a safety concern;

identifying a first safety mechanism within the circuit design, said safety mechanism represented by a second module within the circuit design and having an output port defining a first diagnostic point;

performing, by a processor, a forward path tracing from the at least first one of the plurality of ports to determine if the at least first one of the plurality of ports leads to the first safety mechanism; and establishing that a potential fault appearing at the at least first one of the plurality of ports is detectable at the first diagnostic point if the at least first one of the plurality of ports is determined to lead to the first safety mechanism.

9. The method of claim 8 further comprising:

determining whether at least a second one of the plurality of ports of the first module is not associated with a safety concern.

10. The method of claim 8 further comprising:

identifying a second safety mechanism within the circuit design, said safety mechanism disposed in the first module and having an output port defining a second diagnostic point;

performing a forward path tracing from the at least first one of the plurality of ports to determine if the at least first one of the plurality of ports leads to the second safety mechanism; and establishing that a potential fault appearing at the at least first one of the plurality of ports is detectable at the second diagnostic point if the at least first one of the plurality of ports is determined to lead to the second safety mechanism.

11. The method of claim 10 wherein the first module is disposed in a first hierarchy of the circuit design different from a second hierarchy of the circuit design in which the second module is disposed signal.

12. The method of claim 8 wherein the first module is an intellectual property (IP) module.

13. The method of claim 8 wherein the first and second modules are a same module.

14. The method of claim 8 further comprising:

computing a probability that a node disposed in the path being traced receives a logic 0 or a logic 1; and using the probability in performing the forward path tracing.

15. A system for verifying safety in a circuit design, the system comprising:

a memory storing instructions; and a processor, coupled with the memory and to execute the instructions, the instructions when executed cause the processor to:

receive data representative of the circuit design;

receive identification of a first safety mechanism within the circuit design, said safety mechanism represented by a first module within the circuit design and having an output port defining a first diagnostic point;

receive identification of a plurality of ports of a second module within the circuit design;

receive indication that at least a first one of the plurality of ports of the second module is associated with a safety concern;

perform a backward path tracing from the first diagnostic point to determine if the at least first one of the plurality of ports falls within a cone of influence of the first safety mechanism; and establish that a potential fault appearing at the at least first one of the plurality of ports is detectable at the first diagnostic point if the at least first one of the plurality of ports is determined to fall within the cone of influence of the first safety mechanism.

16. The system of claim 15 wherein the processor is further configured to:

receive indication that at least a second one of the plurality of ports of the second module is not associated with a safety concern.

17. The system of claim 15 wherein the processor is further configured to:

identify a second safety mechanism within the circuit design, the second safety mechanism disposed in the second module and having an output port defining a second diagnostic point;

perform a backward tracing from the second diagnostic point to determine if the at least first one of the plurality of ports falls within a cone of influence of the second safety mechanism; and establish that a potential fault appearing at the at least first one of the plurality of ports is detectable at the second diagnostic point if the at least first one of the plurality of ports is determined to fall within the cone of influence of the second safety mechanism.

18. The system of claim 15 wherein the first module is disposed in a first hierarchy of the circuit design different from a second hierarchy of the circuit design in which the second module is disposed.

19. The system of claim 15 wherein the processor is further configured to:

compute a probability that a node disposed in the path being traced receives a logic 0 or a logic 1; and use the probability in performing the forward path tracing.

20. The system of claim 15 wherein the first and second modules are a same module.

* * * * *